United States Patent
Wei et al.

(10) Patent No.: US 11,069,290 B2
(45) Date of Patent: Jul. 20, 2021

(54) DISPLAY SUBSTRATE, FABRICATION METHOD OF THE DISPLAY SUBSTRATE AND DISPLAY APPARATUS

(71) Applicants: Chengdu BOE OptoElectronics Technology Co., Ltd., Sichuan (CN); BOE Technology Group Co., Ltd., Beijing (CN)

(72) Inventors: Xinyu Wei, Beijing (CN); Dan Cao, Beijing (CN); Yonglin Guo, Beijing (CN); Yiran Li, Beijing (CN); Hongmei Fan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/839,639

(22) Filed: Apr. 3, 2020

(65) Prior Publication Data
US 2021/0150980 A1 May 20, 2021

(30) Foreign Application Priority Data
Nov. 20, 2019 (CN) .......................... 201911142546.X (51) Int. Cl.
G09G 3/30 (2006.01)
G09G 3/3233 (2016.01)
H01L 27/32 (2006.01)
G09G 3/3275 (2016.01)

(52) U.S. Cl.
CPC ......... *G09G 3/3233* (2013.01); *G09G 3/3275* (2013.01); *H01L 27/3276* (2013.01); *G09G 2300/0842* (2013.01); *H01L 2227/323* (2013.01)

(58) Field of Classification Search
CPC .. G09G 3/32; G09G 3/30; G09G 3/34; G09G 3/36; G09G 5/00; G06F 3/038
See application file for complete search history.

(56) References Cited

U.S. PATENT DOCUMENTS

| | | | |
|---|---|---|---|
| 2007/0279337 A1* | 12/2007 | Kim | G09G 3/3233 345/76 |
| 2009/0224335 A1* | 9/2009 | Chang | H01L 29/4238 257/396 |
| 2009/0278835 A1* | 11/2009 | Ka | G09G 3/3233 345/211 |

(Continued)

*Primary Examiner* — Pegeman Karimi
(74) *Attorney, Agent, or Firm* — Muncy, Geissler, Olds & Lowe, P.C.

(57) ABSTRACT

A display substrate, used in a display apparatus, includes a base substrate; a gate line, a data line and a pixel driving circuit on the base substrate, wherein the pixel driving circuit includes a driving transistor; an orthographic projection of the gate line on the base substrate and an orthographic projection of the data line on the base substrate have a first overlapping region, and an orthographic projection of the gate line on the base substrate and an orthographic projection of the control electrode of the driving transistor on the base substrate have a second overlapping region; a width of the gate line in the first overlapping region is less than a first preset width, and a width of the gate line in the second overlapping region is less than the second preset width.

10 Claims, 2 Drawing Sheets

(56) References Cited

U.S. PATENT DOCUMENTS

| | | | |
|---|---|---|---|
| 2016/0078818 A1* | 3/2016 | Kang | G09G 3/3291 |
| | | | 345/212 |
| 2016/0141558 A1* | 5/2016 | Cha | H01L 27/1222 |
| | | | 257/40 |
| 2016/0379707 A1* | 12/2016 | Yang | G11C 7/18 |
| | | | 365/63 |

* cited by examiner

DISPLAY SUBSTRATE, FABRICATION METHOD OF THE DISPLAY SUBSTRATE AND DISPLAY APPARATUS

CROSS-REFERENCE TO RELATED APPLICATION

The present application claims a priority to Chinese Patent Application No. 201911142546.X filed in China on Nov. 20, 2019, the disclosure of which is incorporated herein in its entirety by reference.

TECHNICAL FIELD

The present disclosure relates to the field of display technology, and in particular to a display substrate, a fabrication method of the display substrate and a display apparatus.

BACKGROUND

Compared with traditional LCD panels, AMOLED (Active Matrix Organic Light Emitting Diode) panels have the advantages of fast response, high contrast, and wide viewing angles, therefore AMOLED panels have become a significant development direction of the next generation of display apparatus, and attracted more and more attention.

At present, in the research on AMOLED display apparatus, it is found that AMOLED display apparatus have crosstalk problems caused by signal jumps on data lines, which reduces the display quality of display apparatus.

SUMMARY

In order to solve the above technical problems, the technical solutions provided by the present disclosure are as follows:

First, an embodiment of the present disclosure provides a display substrate, including:

a base substrate;

a gate line, a data line and a pixel driving circuit on the base substrate, wherein the pixel driving circuit includes a driving transistor;

an orthographic projection of the gate line on the base substrate and an orthographic projection of the data line on the base substrate have a first overlapping region, and an orthographic projection of the gate line on the base substrate and an orthographic projection of the control electrode of the driving transistor on the base substrate have a second overlapping region;

a width of the gate line in the extending direction of the data line in the first overlapping region is less than a first preset width, and a width of the gate line in the extending direction of the data line in the second overlapping region is less than the second preset width.

Further, the gate line includes a first portion, a second portion and a third portion other than the first portion and the second portion; the first portion is a portion of the gate line located in the first overlapping region, and the second portion is a portion of the gate line located in the second overlapping region.

Further, the first preset width is less than or equal to a width of the third portion in an extending direction of the data line.

Further, the second preset width is less than or equal to a width of the third portion in an extending direction of the data line.

Further, the data line includes a fourth portion and a fifth portion other than the fourth portion, the fourth portion is a portion of the data line located in the first overlapping region, the width of the fourth portion in the extending direction of the data line is less than the width of the fifth portion in the extending direction of the data line.

Further, the control electrode of the driving transistor includes a sixth portion and a seventh portion other than the sixth portion, the sixth portion is a portion of the control electrode of the driving transistor located in the second overlapping region, the width of the sixth portion in the extending direction of the control electrode of the driving transistor is less than the width of the seventh portion in the extending direction of the control electrode of the driving transistor.

Further, the pixel driving circuit further includes a storage capacitor, a first transistor, a second transistor, a third transistor, a fourth transistor, a fifth transistor, and a sixth transistor; wherein one terminal of the storage capacitor is connected to a power supply line, and the other terminal of the storage capacitor is connected to a first node;

a control electrode of the first transistor is connected to a first reset signal line, a first electrode of the first transistor is connected to the first node, and a second electrode of the first transistor is connected to an initialization voltage level signal line;

a control electrode of the second transistor is connected to a first light-emitting control signal line, a first electrode of the second transistor is connected to the power supply line, and a second electrode of the second transistor is connected to the first node;

a control electrode of the third transistor is connected to the gate line, a first electrode of the third transistor is connected to the data line, a second electrode of the third transistor is connected to a second electrode of the second transistor;

the control electrode of the driving transistor is connected to the first node, a first electrode of the driving transistor is connected to the second electrode of the second transistor, and a second electrode of the driving transistor is connected to a first electrode of the fourth transistor;

a control electrode of the fourth transistor is connected to the gate line, and a second electrode of the fourth transistor is connected to the first node;

a control electrode of the fifth transistor is connected to a second light-emitting control signal line, a first electrode of the fifth transistor is connected to the second electrode of the driving transistor, and a second electrode of the fifth transistor is connected to an anode of the light-emitting element; and a control electrode of the sixth transistor is connected to a second reset signal line, a first electrode of the sixth transistor is connected to the initialization voltage level signal line, and a second electrode of the sixth transistor is connected to an anode of the light-emitting element.

Second, an embodiment of the present disclosure also provides a fabrication method of the display substrate as described above, including:

providing a base substrate; and forming a gate line pattern, a data line pattern and a control electrode pattern of a driving transistor on the base substrate, respectively;

wherein, an orthographic projection of the grid line pattern on the base substrate and an orthographic projection of the data line pattern on the base substrate have a first overlapping region, an orthographic projection of the gate line pattern on the base substrate and an orthographic projection of the control electrode pattern of the driving transistor on the base substrate have a second overlapping region;

a width of the gate line in the extending direction of the data line in the first overlapping region is less than a first preset width, and a width of the gate line in the extending direction of the data line in the second overlapping region is less than the second preset width.

Further, the step of forming a gate line pattern on the base substrate, including:

forming a gate line material layer on the base substrate;

forming a photoresist on the gate line material layer, exposing the photoresist, and developing a photoresist pattern after development; and using the photoresist pattern as a mask, etching the gate line material layer to form a gate line pattern, wherein the gate line pattern includes a first portion, a second portion and a third portion other than the first portion and the second portion, the first portion is a portion of the gate line located in the first overlapping region, and the second portion is a portion of the gate line located in the second overlapping region.

Third, an embodiment of the present disclosure also provides a display panel including the display substrate as described above.

Fourth, an embodiment of the present disclosure also provides a display panel including the display substrate as described above.

BRIEF DESCRIPTION OF THE DRAWINGS

To better clarify technical solutions of embodiments of the present disclosure, drawings used in description of the embodiments are briefly introduced hereinafter. Apparently, the described drawings merely illustrate a part of the disclosed embodiments. A person of ordinary skill in the art can obtain other drawings based on the described drawings without any creative efforts.

DETAILED DESCRIPTION

Hereinafter, the technical solutions in embodiments of the present disclosure are described clearly and completely in conjunction with drawings in the embodiments of the present disclosure. Apparently, the described embodiments are merely a part of rather than all the embodiments of the present disclosure. All other embodiments obtained by a person of ordinary skill in the art based on the described embodiments of the present disclosure, without creative efforts, shall fall within the scope of the present disclosure.

The transistors used in all the embodiments of the present disclosure may be transistors, thin film transistors or field effect transistors or other devices with the same characteristics. In the embodiment of the present disclosure, in order to distinguish the two electrodes of the transistor other than the control electrode, one of the electrodes is referred to as a first electrode and the other electrode is referred to as a second electrode.

In actual operation, when the transistor is a transistor, the control electrode may be a base electrode, the first electrode may be a collector electrode, and the second electrode may be an emitter electrode; or the control electrode may be a base electrode, the first electrode may be an emitter electrode, and the second electrode may be a collector electrode.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

In the display substrate, since the orthographic projection of the data line on the base substrate and the orthographic projection of the grid line on the base substrate have an overlapping area, a first capacitor is formed between the data line and the grid line. Similarly, the orthographic projection of the gate line on the base substrate and the orthographic projection of the gate electrode of the driving transistor in the pixel driving circuit on the base substrate have an overlapping area, a second capacitor is also formed between the gate line and the gate electrode of the driving transistor.

In this way, when the signal on the data line changes, when the signal on the data line jumps, the voltage fluctuation on the gate line will be caused by the first capacitor, and the voltage fluctuation on the gate line will cause the voltage fluctuation on the gate electrode of the driving transistor by the second capacitor. As a result, crosstalk is formed and the display quality of the display substrate is degraded.

The display substrate, the fabrication method of the display substrate and the display apparatus provided in the embodiments of the present disclosure can solve the problem of crosstalk caused by pixel current jump in the display apparatus of the related art and the display quality degradation of a display apparatus.

Figure 1:
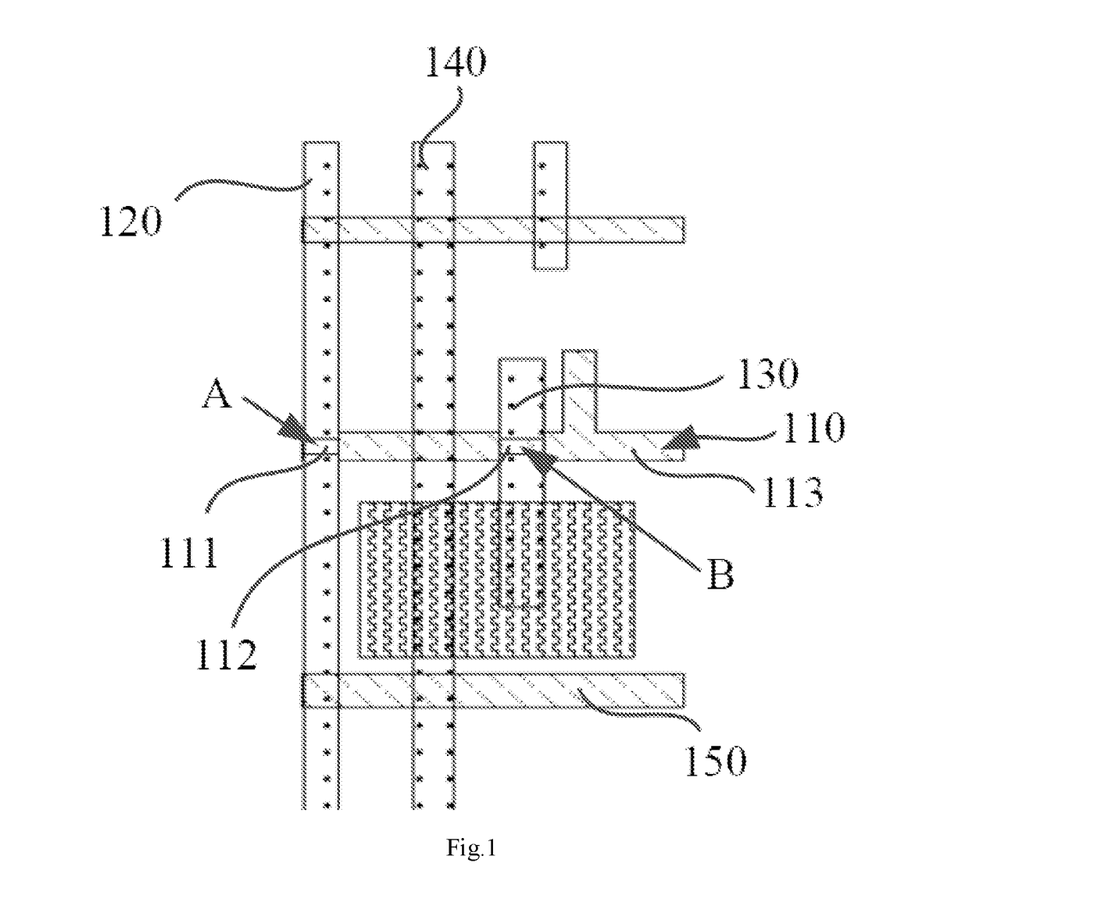
FIG. 1 is a schematic structural diagram of a display substrate according to an embodiment of the present disclosure

An embodiment of the present disclosure provides a display substrate, as shown in FIG. 1, the display substrate includes a base substrate, a gate line 110, a data line 120, and a pixel driving circuit on the base substrate, wherein, the pixel driving circuit includes a driving transistor.

An orthographic projection of the gate line 110 on the base substrate and an orthographic projection of the data line 120 on the base substrate have a first overlapping region A, and an orthographic projection of the gate line 110 on the base substrate and an orthographic projection of the control electrode 130 of the driving transistor on the base substrate have a second overlapping region B.

The area of the first overlapping region A and/or the area of the second overlapping region B is smaller than a preset area. Further, a width of the gate line in the extending direction of the data line in the first overlapping region A is less than a first preset width, and a width of the gate line in the extending direction of the data line in the second overlapping region B is less than the second preset width.

In the embodiment of the present disclosure, by setting the area of the first overlapping region A to be smaller than the preset area, it is possible to ensure that the capacitance between the gate line and the data line is small, which can reduce the voltage fluctuations caused by signal jumps on the data lines; and/or by setting the area of the second overlapping region B to be smaller than a preset area, it is possible to ensure that the capacitance between the gate line and the control electrode of the driving transistor is small, which can reduce voltage fluctuation of the control electrode of the driving transistor caused by the voltage fluctuation on the gate line, thereby the crosstalk problem caused by the signal jump on the data line can be overcome, and the display quality of the display apparatus is improved. Therefore, the technical solution provided by the present disclosure can solve the crosstalk problem caused by the signal jump on the data line, and improve the display quality of the display apparatus.

The display substrate may be a flexible display substrate or a rigid display substrate. When the display substrate is a flexible display substrate, the base substrate is a flexible substrate, such as a polyimide film; when the display substrate is a rigid display substrate, the base substrate is a rigid substrate, such as a quartz substrate or a glass substrate.

As shown in FIG. 1, the gate lines 110 may extend in a row direction on the base substrate, and the data lines 120 may extend in a column direction on the base substrate. The plurality of gate lines 110 and the plurality of data lines 120 divide a plurality of pixel regions, each pixel region including a pixel driving circuit. As shown in FIG. 1, the pixel driving circuit is connected to the gate line 110, the data line 120, the power supply line 140, the light-emitting control signal line 150, and light-emitting element in a pixel region, respectively.

The pixel driving circuit includes a driving transistor, a first electrode of the driving transistor is connected with a power supply line, a second electrode of the driving transistor is connected to a light-emitting element. The control electrode 130 of the driving transistor turns on/off the connection between the first electrode of the driving transistor and the second electrode of the driving transistor. The voltage of the control electrode 130 of the driving transistor directly affects the charging effect of the light-emitting element, that is, it directly affects the light-emitting quality of the light-emitting element.

The gate lines 110, data lines 120, and control electrodes 130 of the driving transistors may be located on different functional film layers on the base substrate, respectively. In the first overlapping region A, the orthographic projection of the gate lines on the base substrate overlaps with the orthographic projection of the data lines on the base substrate; in the second overlapping region B, the orthographic projection of the gate lines on the base substrate overlaps with the orthographic projection of the control electrode of the driving transistor on the base substrate.

The smaller the area of the first overlapping region A, the smaller the capacitance formed between the gate line 110 and the data line 120, so that the voltage fluctuation on the gate line 110 caused by the signal jump on the data line 120 is also small. Further, the voltage fluctuation on the control electrode 130 of the driving transistor caused by the voltage fluctuation on the gate line 110 is reduced to achieve the effect of reducing crosstalk.

Similarly, the smaller the area of the second overlapping region B, the smaller the capacitance formed between the gate line 110 and the control electrode 130 of the driving transistor, so that the voltage fluctuation on the control electrode 130 of the driving transistor caused by the voltage fluctuation on the gate line 110 is also small, so as to achieve the effect of reducing crosstalk.

Specifically, the simulation results of capacitance values with different proportions are shown in the following table:

| Simulation Results | | | | |
|---|---|---|---|---|
| Capacitance Ratio | Sub-pixel | Data Voltage | Crosstalk (percent) | Average Crosstalk (percent) |
| 0.5 | red | 4.045 | 0.723% | 0.782% |
| | green | 4.385 | 0.877% | |

| Simulation Results | | | | |
|---|---|---|---|---|
| Capacitance Ratio | Sub-pixel | Data Voltage | Crosstalk (percent) | Average Crosstalk (percent) |
| 1 | blue | 3.688 | 0.651% | 0.836% |
| | red | 3.855 | 0.770% | |
| | green | 4.200 | 0.939% | |
| | blue | 3.500 | 0.694% | |

It can be seen that when the capacitance formed between the gate line 110 and the data line 120, and/or, the capacitance formed between the gate line 110 and the control electrode 130 of the driving transistor is reduced, the effect of reducing crosstalk can be achieved.

Further, as shown in FIG. 1, the gate line 110 includes a first portion 111, a second portion 112 and a third portion 113 other than the first portion and the second portion; the first portion 111 is a portion of the gate line located in the first overlapping region, and the second portion 112 is a portion of the gate line located in the second overlapping region.

That is, the portion of the gate line 110 located in the first overlapping region A is the first portion 111, the portion of the gate line 110 located in the second overlapping region B is the second portion 112. The remaining portions of the gate line 110 except the first portion 111 and the second portion 112 are third portions 113, for example: the portion of the gate line 110 between the first portion 111 and the second portion 112 is the third portion 113; the portion of the gate line 110 located on a side of the first portion 111 away from the second portion 112 is also the third portion 113; the portion of the gate line 110 located on a side of the second portion 112 away from the first portion 111 is also the third portion 113.

In an optional embodiment, a width of the first portion 111 in the extending direction of the data line 120 is smaller than a width of the third portion 113 in the extending direction of the data line 120.

In this embodiment, by reducing the width of the first portion 111 in the extending direction of the data line 110, the overlapping area of the orthographic projection of the gate line 110 on the base substrate and the orthographic projection of the data line 120 on the base substrate is reduced, that is, the area of the first overlapping region A is reduced. As shown in FIG. 1, the extending direction of the gate line 110 is a row direction, which is perpendicular to the extending direction of the data line 120.

In this way, the capacitance between the gate line 110 and the data line 120 can be reduced, so that the voltage fluctuation on the gate line 110 caused by the signal jump on the data line 120 is also reduced. The voltage fluctuation on the control electrode 130 of the driving transistor caused by the voltage fluctuation on the gate line 110 is reduced, such that the effect of reducing crosstalk is achieved.

In another optional implementation manner, a width of the second portion 112 in the extending direction of the data line 120 is smaller than a width of the third portion 113 in the extending direction of the data line 120.

In this embodiment, by reducing the width of the second portion 112 in the extending direction of the data line 110, the overlapping area of the orthographic projection of the gate line 110 on the base substrate and the orthographic projection of the control electrode 130 of the driving transistor on the base substrate is reduced, that is, the area of the second overlapping region B is reduced. As shown in FIG.

1, the extending direction of the data line 120 is a column direction, which is perpendicular to the extending direction of the gate line 110.

In this way, the capacitance between the gate line 110 and the control electrode 130 of the driving transistor can be reduced, so that the voltage fluctuation on the control electrode 130 of the driving transistor caused by the voltage fluctuation on the gate line 110 is also small, thereby the effect of crosstalk reduction is achieved.

In another optional implementation manner, the data line 120 includes a fourth portion and a fifth portion other than the fourth portion. The fourth portion is a portion of the data line located in the first overlapping region, and the width of the fourth portion in the extending direction of the data line 120 is smaller than the width of the fifth portion in the extending direction of the data line 120.

In this embodiment, by reducing the width of the fourth portion in the extending direction of the data line 120, the overlapping area of the orthographic projection of the gate line 110 on the base substrate and the orthographic projection of the data line 120 on the base substrate is reduced, that is, the area of the first overlapping region A is reduced.

This embodiment can be applied to a case where the width of the first portion 111 of the gate line 110 in the extending direction of the data line 120 is equal to the width of the third portion 113 of the gate line 110 in the extending direction of the data line 120, or a case where the width of the first portion 111 of the gate line 110 in the extending direction of the data line 120 is smaller than the width of the third portion 113 of the gate line 110 in the extending direction of the data line 120.

In this way, the capacitance between the gate line 110 and the data line 120 can be reduced, so that the voltage fluctuation on the gate line 110 caused by the signal jump on the data line 120 is also reduced. The voltage fluctuation on the control electrode 130 of the driving transistor caused by the voltage fluctuation on the gate line 110 is reduced to achieve the effect of reducing crosstalk.

In another optional implementation manner, the control electrode 130 of the driving transistor includes a sixth portion and a seventh portion other than the sixth portion, and the sixth portion is the portion of the control electrode of the driving transistor located at the second overlapping region. The width of the sixth portion in the extending direction of the control electrode 130 of the driving transistor is smaller than the width of the seventh portion in the extending direction of the control electrode 130 of the driving transistor.

In this embodiment, by reducing the width of the sixth portion in the extension direction of the control electrode of the driving transistor 130, the overlapping area between the orthographic projection of gate line 110 on the base substrate and the orthographic projection of the control electrode 130 of the driving transistor on the base substrate is reduced, that is, the area of the second overlapping region B is reduced. As shown in FIG. 1, the extending direction of the control electrode 130 of the driving transistor is the column direction, parallel to the extending direction of the data line 120.

This embodiment can be applied to a case where the width of the second portion 112 of the gate line 110 in the extending direction of the data line 120 is equal to the width of the third portion 113 of the gate line 110 in the extending direction of the data line 120, or a case where the width of the second portion 112 of the gate line 110 in the extending direction of the data line 120 is smaller than the width of the third portion 113 of the gate line 110 in the extending direction of the data line 120.

In this way, the capacitance between the gate line 110 and the control electrode 130 of the driving transistor can be reduced, so that the voltage fluctuation on the control electrode 130 of the driving transistor caused by the voltage fluctuation on the gate line 110 is also small, thereby the effect of crosstalk reduction is achieved.

Figure 2:
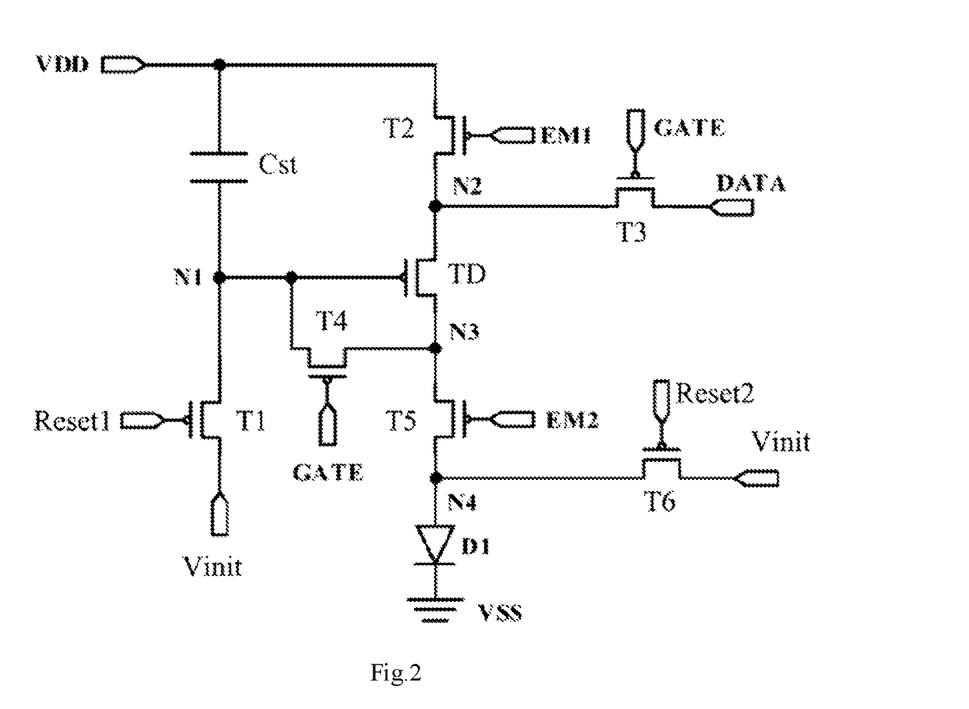
FIG. 2 is a schematic structural diagram of a pixel driving circuit of a display substrate according to an embodiment of the present disclosure.

Further, as shown in FIG. 2, the pixel driving circuit further includes a storage capacitor Cst, a first transistor T1, a second transistor T2, a third transistor T3, a fourth transistor T4, a fifth transistor T5, and a sixth transistor T6; wherein one terminal of the storage capacitor Cst is connected to a power supply line VDD, and the other terminal of the storage capacitor Cst is connected to a first node N1;

a control electrode of the first transistor T1 is connected to a first reset signal line Reset1, a first electrode of the first transistor T1 is connected to the first node, and a second electrode of the first transistor T1 is connected to an initialization voltage level signal line Vinit;

a control electrode of the second transistor T2 is connected to a first light-emitting control signal line EM1, a first electrode of the second transistor T2 is connected to the power supply line, and a second electrode of the second transistor T2 is connected to the first node;

a control electrode of the third transistor T3 is connected to the gate line, a first electrode of the third transistor T3 is connected to the data line, a second electrode of the third transistor T3 is connected to a second electrode of the second transistor T2;

the control electrode of the driving transistor TD is connected to the first node, a first electrode of the driving transistor TD is connected to the second electrode of the second transistor T2, and a second electrode of the driving transistor TD is connected to a first electrode of the fourth transistor T4;

a control electrode of the fourth transistor T4 is connected to the gate line, and a second electrode of the fourth transistor T4 is connected to the first node;

a control electrode of the fifth transistor T5 is connected to a second light-emitting control signal line EM2, a first electrode of the fifth transistor T5 is connected to the second electrode of the driving transistor TD, and a second electrode of the fifth transistor T5 is connected to an anode of the light-emitting element EL; and a control electrode of the sixth transistor T6 is connected to a second reset signal line Reset2, a first electrode of the sixth transistor T6 is connected to the initialization voltage level signal line, and a second electrode of the sixth transistor T6 is connected to an anode of the light-emitting element.

The embodiment of the pixel circuit shown in FIG. 2 is merely an embodiment, and the pixel circuit in the embodiment of the present disclosure is not limited thereto.

In this embodiment, a 7T1C pixel driving circuit as shown in FIG. 2 is used. The driving circuit controls the light-emitting state of the light-emitting element EL through seven transistors and a storage capacitor Cst. The working process of the pixel driving circuit mainly includes four stages including an initialization stage, a data writing and compensation stage, a reset stage, and a light emitting stage. The working process of the pixel driving circuit is briefly described below.

First, in the initialization stage, the first transistor T1 is turned on under the control of the first reset signal of the first reset signal line Reset1, and a reset voltage is applied to the control electrode of the driving transistor TD. The second transistor T2 is turned on under the control of the control signal, and a power source voltage is applied to the first electrode (the second node N2) of the driving transistor TD. At this time, the third transistor T3, the fourth transistor T4, the fifth transistor T5, and the sixth transistor T6 are in an off state.

In the initialization stage, since the first transistor T1 is turned on, a reset voltage can be applied to the control electrode of the driving transistor TD, and the driving transistor TD is kept in an on state by the reset voltage.

In the data writing and compensation stage, the third transistor T3, the driving transistor TD, and the fourth transistor T4 are turned on under the control of the scanning signal on the gate line and the data signal on the data line. The third transistor T3 writes the data signal to the first electrode (second node N2) of the driving transistor TD, and the control electrode (first node N1) of the driving transistor TD is charged through the driving transistor TD and the fourth transistor T4 until the voltage of the control electrode of the driving transistor TD is equal to (Vdata-Vth), where Vdata is the voltage value of the data signal, Vth is the threshold voltage of the driving transistor TD, and this voltage is stored by the storage capacitor Cst, so the data voltage Vdata is written to the control electrode of the driving transistor TD and is stored by the storage capacitor Cst, and the fourth transistor T4 performs threshold compensation on the driving transistor TD. At this time, the third transistor T3 and the fourth transistor T4 are turned on under the control of the scan signal, and the first transistor T1, the second transistor T2, the fifth transistor T5, and the sixth transistor T6 are in an off state.

Therefore, in the data writing and compensation stage, the data signal charges the first node N1 after passing through the third transistor T3, the driving transistor TD and the fourth transistor T4 (that is, the storage capacitor Cst is charged), so that in the subsequent light-emitting stage provide gray-scale display data and compensate the threshold voltage of the driving transistor TD itself.

In the reset stage, the second light-emitting control signal on the second light-emitting control signal line EM2 and the second reset signal on the second reset signal line turn on the fifth transistor T5 and the sixth transistor T6, reset the driving transistor TD, the fourth transistor T4 and the light-emitting element EL.

In this reset stage, the fifth transistor T5 is turned on under the control of the second light-emitting control signal, and the sixth transistor T6 is turned on under the control of the second reset signal; at the same time, the third transistor T3, the fourth transistor T4, the first transistor T1 and the second transistor T2 are turned off. At this time, the drain of the driving transistor TD is discharged through the fifth transistor T5 and the sixth transistor T6, thereby the potentials of the third node N3 and the fourth node N4 (the anode of the light-emitting element EL) are reset at the same time. The light-emitting element EL does not emit light before the light-emitting stage.

In the light emitting stage, under the control of the first light-emitting control signal of the first light-emitting control signal line EM1 and the first light-emitting control signal of the second light-emitting control signal line EM2, the first transistor T1, the fifth transistor T5, and the driving transistor TD are turned on. Thus, a driving current is applied to the anode of the light-emitting element EL to cause it to emit light. In the light-emitting stage, the anode and the cathode of the light-emitting element EL are respectively applied with a voltage to emit light under the action of a driving current flowing through the driving transistor TD. The light emitting element EL may be an organic light emitting diode (OLED), a quantum dot light emitting diode (QLED), or the like.

The display substrate may further include a scan driving circuit and a data driving circuit. The data driving circuit is connected to a plurality of data signal lines to provide data signals respectively. In addition, the data driving circuit can also be connected to a plurality of power supply lines VDD and a plurality of initialization voltage level signal lines Vinit to provide power supply signals and initialization signals respectively. The scan driving circuit is connected to a plurality of gate lines to provide a scan signal. In addition, the scan driving circuit may also be connected to a plurality of light-emitting control lines EM to provide a first light-emitting control signal and a second light-emitting control signal, and connected to a plurality of reset signal lines Reset to provide a reset signal.

The embodiment of the present disclosure also provides a fabrication method of the display substrate as described above, which includes:

providing a base substrate;

forming a gate line pattern, a data line pattern and a control electrode pattern of a driving transistor on the base substrate, respectively;

an orthographic projection of the grid line pattern on the base substrate and an orthographic projection of the data line pattern on the base substrate have a first overlapping region A, an orthographic projection of the gate line pattern on the base substrate and an orthographic projection of the control electrode pattern of the driving transistor on the base substrate have a second overlapping region B;

the area of the first overlapping region A and/or the area of the second overlapping region B is smaller than a preset area. Further, a width of the gate line in the extending direction of the data line in the first overlapping region A is less than a first preset width, and a width of the gate line in the extending direction of the data line in the second overlapping region B is less than the second preset width.

In the embodiment of the present disclosure, by designing the area of the first overlapping region A to be smaller than the preset area, it is possible to ensure that the capacitance formed between the gate line and the data line is small, which can reduce the influence of signal jumps on the data lines on the voltage fluctuations; and/or reducing the area of the second overlapping region B to be smaller than a preset area, it is possible to ensure that the capacitance between the gate line and the control electrode of the driving transistor is small, which can reduce the voltage fluctuation of the control electrode of the driving transistor caused by the voltage fluctuation on the gate line, thereby solving the crosstalk problem caused by the signal jump on the data line, and improving the display quality of the display apparatus. Therefore, the technical solution provided by the present disclosure can solve the crosstalk problem caused by the signal jump on the data line, and improve the display quality of the display apparatus.

The display substrate may be a flexible display substrate or a rigid display substrate. When the display substrate is a flexible display substrate, the base substrate is a flexible substrate, such as a polyimide film; when the display substrate is a rigid display substrate, the base substrate is a rigid substrate, such as a quartz substrate or a glass substrate.

The gate lines may extend in a row direction on the base substrate, and the data lines may extend in a column direction on the base substrate. The plurality of gate lines and the plurality of data lines 1 divide a plurality of pixel regions, where each pixel region includes a pixel driving circuit. As shown in FIG. 1, the pixel driving circuit is connected to the gate line, the data line, the power supply line, the light-emitting control signal line, and light-emitting element in a pixel region, respectively.

The pixel driving circuit includes a driving transistor, a first electrode of the driving transistor is connected with a power supply line, a second electrode of the driving transistor is connected to a light-emitting element. The control electrode of the driving transistor turns on/off the connection between the first electrode of the driving transistor and the second electrode of the driving transistor. The voltage of the control electrode of the driving transistor directly affects the charging effect of the light-emitting element, that is, it directly affects the light-emitting quality of the light-emitting element.

The gate lines, data lines, and control electrodes of the driving transistors may be located on different functional film layers on the base substrate, respectively. In the first overlapping region A, the orthographic projection of the gate lines on the base substrate overlaps with the orthographic projection of the data lines on the base substrate; in the second overlapping region B, the orthographic projection of the gate lines on the base substrate overlaps with the orthographic projection of the control electrode of the driving transistor on the base substrate.

The smaller the area of the first overlapping region A, the smaller the capacitance formed between the gate line and the data line, so that the voltage fluctuation on the gate line caused by the signal jump on the data line is also smaller. Further, the voltage fluctuation on the control electrode of the driving transistor caused by the voltage fluctuation on the gate line is reduced to achieve the effect of reducing crosstalk.

Similarly, the smaller the area of the second overlapping region B, the smaller the capacitance formed between the gate line and the control electrode of the driving transistor, so that the voltage fluctuation on the control electrode of the driving transistor caused by the voltage fluctuation on the gate line is also smaller to achieve the effect of reducing crosstalk.

The step of forming a gate line pattern on the base substrate including:

forming a gate line material layer on the base substrate;
forming a photoresist on the gate line material layer, exposing the photoresist, and developing a photoresist pattern after development; and
using the photoresist pattern as a mask, etching the gate line material layer to form a gate line pattern, wherein the gate line pattern includes a first portion, a second portion and a third portion other than the first portion and the second portion, the first portion is a portion of the gate line located in the first overlapping region A, and the second portion is a portion of the gate line located in the second overlapping region B.

When the photoresist is exposed, the width of the light-transmitting area of the mask corresponding to the first overlapping region A and/or the second overlapping region B is smaller than the width of the other regions. The width of the photoresist portion on the first overlapping region A, and/or the width of the photoresist portion on the second overlapping region B is smaller than the photoresist portion on the other regions. Then, the width of the portion of the gate line pattern obtained after the etching corresponding to the first overlapped region A and/or the second overlapped region B is smaller than the widths of other regions.

That is, the portion of the gate line located in the first overlapping region A is the first portion, the portion of the gate line located in the second overlapping region B is the second portion. The remaining portions of the gate line except the first portion and the second portion are third portions, for example: the portion of the gate line between the first portion and the second portion is the third portion; the portion of the gate line located on the side of the first portion away from the second portion is also the third portion; the portion of the gate line located on the side of the second portion away from the first portion is also the third portion.

In an optional embodiment, a width of the first portion in the extending direction of the data line is smaller than a width of the third portion in the extending direction of the data line.

In this embodiment, by reducing the width of the first portion in the extending direction of the data line, the overlapping area of the orthographic projection of the gate line on the base substrate and the orthographic projection of the data line on the base substrate is reduced, that is, the area of the first overlapping region A is reduced.

In this way, the capacitance between the gate line and the data line can be reduced, so that the voltage fluctuation on the gate line caused by the signal jump on the data line is also reduced. The voltage fluctuation on the control electrode of the driving transistor caused by the voltage fluctuation on the gate line is reduced to achieve the effect of reducing crosstalk.

In another optional implementation manner, a width of the second portion in the extending direction of the data line is smaller than a width of the third portion in the extending direction of the data line.

In this embodiment, by reducing the width of the second portion in the extending direction of the data line, the overlapping area of the orthographic projection of the gate line on the base substrate and the orthographic projection of the control electrode of the driving transistor on the base substrate is reduced, that is, the area of the second overlapping region B is reduced.

In this way, the capacitance between the gate line and the control electrode of the driving transistor can be reduced, so that the voltage fluctuation on the control electrode of the driving transistor caused by the voltage fluctuation on the gate line is also small, thereby the effect of crosstalk reduction is achieved.

The embodiment of the present disclosure also provides a display panel including the display substrate as described above.

The embodiment of the present disclosure also provides a display apparatus including the display substrate as described above.

The display apparatus may be a display, a mobile phone, a tablet computer, a television, a wearable electronic device, a navigation display apparatus, and the like.

In the technical solution provided by the present disclosure, by setting the area of the first overlapping region to be smaller than the preset area, it is possible to ensure that the capacitance formed between the gate line and the data line is small, which can reduce the voltage fluctuations caused by the signal jumps on the data lines; and/or by setting the area of the second overlapping region to be smaller than a preset area, it is possible to ensure that the capacitance between the gate line and the control electrode of the driving transistor is small, which can reduce the voltage fluctuation of the control electrode of the driving transistor caused by the voltage fluctuation on the gate line, thereby the crosstalk problem caused by the signal jump on the data line can be overcome, and the display quality of the display apparatus can be improved. Therefore, the technical solution provided by the present disclosure can overcome the crosstalk problem caused by the signal jump on the data line, and improve the display quality of the display apparatus.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. Expressions such as "connection" or "connected" are not limited to denote physical or mechanical connections, but may include electrical connections, whether direct or indirect. "Up", "down", "left", "right", etc. are only used to indicate the relative position relationship. When the absolute position of the described object changes, the relative position relationship changes accordingly.

The above descriptions merely describe optional implementations of the present disclosure. It is appreciated, modifications and improvements may be made by a person of ordinary skill in the art without departing from the principle of the present disclosure, and these modifications and improvements shall fall within the scope of the present disclosure.

What is claimed is:

1. A display substrate, comprising:
   a base substrate;
   a gate line, a data line and a pixel driving circuit on the base substrate, wherein the pixel driving circuit comprises a driving transistor;
   an orthographic projection of the gate line on the base substrate and an orthographic projection of the data line on the base substrate have a first overlapping region, and an orthographic projection of the gate line on the base substrate and an orthographic projection of the control electrode of the driving transistor on the base substrate have a second overlapping region;
   a width of the gate line in an extending direction of the data line in the first overlapping region is less than a first preset width, and a width of the gate line in the extending direction of the data line in the second overlapping region is less than a second preset width,
   wherein the gate line comprises a body portion extending perpendicular to the data line and a protrusion portion extending parallel to the data line, the body portion comprises a first portion, a second portion and a third portion other than the first portion and the second portion; the first portion is a portion of the gate line located in the first overlapping region, and the second portion is a portion of the gate line located in the second overlapping region,
   wherein the first preset width is less than or equal to a width of the third portion in an extending direction of the data line, and/or
   wherein the second preset width is less than or equal to a width of the third portion in an extending direction of the data line.

2. The display substrate according to claim 1, wherein the data line comprises a fourth portion and a fifth portion other than the fourth portion, the fourth portion is a portion of the data line located in the first overlapping region, the width of the fourth portion in the extending direction of the data line is less than the width of the fifth portion in the extending direction of the data line.

3. The display substrate according to claim 1, wherein the data line comprises a fourth portion and a fifth portion other than the fourth portion, the fourth portion is a portion of the data line located in the first overlapping region, the width of the fourth portion in the extending direction of the data line is less than the width of the fifth portion in the extending direction of the data line.

4. The display substrate according to claim 1, wherein the control electrode of the driving transistor comprises a sixth portion and a seventh portion other than the sixth portion, the sixth portion is a portion of the control electrode of the driving transistor located in the second overlapping region, the width of the sixth portion in the extending direction of the control electrode of the driving transistor is less than the width of the seventh portion in the extending direction of the control electrode of the driving transistor.

5. The display substrate according to claim 1, wherein the control electrode of the driving transistor comprises a sixth portion and a seventh portion other than the sixth portion, the sixth portion is a portion of the control electrode of the driving transistor located in the second overlapping region, the width of the sixth portion in the extending direction of the control electrode of the driving transistor is less than the width of the seventh portion in the extending direction of the control electrode of the driving transistor.

6. The display substrate according to claim 1, wherein the pixel driving circuit further comprises a storage capacitor, a first transistor, a second transistor, a third transistor, a fourth transistor, a fifth transistor, and a sixth transistor; wherein
   one terminal of the storage capacitor is connected to a power supply line, and the other terminal of the storage capacitor is connected to a first node;
   a control electrode of the first transistor is connected to a first reset signal line, a first electrode of the first transistor is connected to the first node, and a second electrode of the first transistor is connected to an initialization voltage level signal line;
   a control electrode of the second transistor is connected to a first light-emitting control signal line, a first electrode of the second transistor is connected to the power supply line, and a second electrode of the second transistor is connected to the first node;
   a control electrode of the third transistor is connected to the gate line, a first electrode of the third transistor is connected to the data line, a second electrode of the third transistor is connected to a second electrode of the second transistor;
   the control electrode of the driving transistor is connected to the first node, a first electrode of the driving transistor is connected to the second electrode of the second transistor, and a second electrode of the driving transistor is connected to a first electrode of the fourth transistor;
   a control electrode of the fourth transistor is connected to the gate line, and a second electrode of the fourth transistor is connected to the first node;
   a control electrode of the fifth transistor is connected to a second light-emitting control signal line, a first electrode of the fifth transistor is connected to the second electrode of the driving transistor, and a second electrode of the fifth transistor is connected to an anode of the light-emitting element; and
   a control electrode of the sixth transistor is connected to a second reset signal line, a first electrode of the sixth transistor is connected to the initialization voltage level signal line, and a second electrode of the sixth transistor is connected to an anode of the light-emitting element.

7. A fabrication method of the display substrate according to claim 1, comprising:
   providing a base substrate; and forming a gate line pattern, a data line pattern and a control electrode pattern of a driving transistor on the base substrate respectively; wherein, an orthographic projection of the gate line pattern on the base substrate and an orthographic projection of the data line pattern on the base substrate have a first overlapping region, an orthographic projection of the gate line pattern on the base substrate and an orthographic projection of the control electrode pattern of the driving transistor on the base substrate have a second overlapping region;

a width of the gate line in the extending direction of the data line in the first overlapping region is less than a first preset width, and a width of the gate line in the extending direction of the data line in the second overlapping region is less than the second preset width.

8. The fabrication method of the display substrate according to claim 7, the step of forming a gate line pattern on the base substrate comprising:

forming a gate line material layer on the base substrate;

forming a photoresist on the gate line material layer, exposing the photoresist, and developing a photoresist pattern after development; and using the photoresist pattern as a mask, etching the gate line material layer to form a gate line pattern, wherein the gate line pattern comprises a first portion, a second portion and a third portion other than the first portion and the second portion, the first portion is a portion of the gate line located in the first overlapping region, and the second portion is a portion of the gate line located in the second overlapping region.

9. A display panel comprising the display substrate according to claim 1.

10. A display apparatus comprising the display substrate according to claim 1.

* * * * *